(12) United States Patent
Mescher et al.

(10) Patent No.: US 7,215,213 B2
(45) Date of Patent: May 8, 2007

(54) APPARATUS AND SYSTEM FOR SUSPENDING A CHIP-SCALE DEVICE AND RELATED METHODS

(75) Inventors: Mark J. Mescher, West Newton, MA (US); Mathew Varghese, Arlington, MA (US); Marc Steven Weinberg, Needham, MA (US); Thomas Marinis, Haverhill, MA (US); Joseph W. Soucy, Winchester, MA (US)

(73) Assignee: Charles Stark Draper Laboratory, Inc., The, Cambridge, MA (US)

( * ) Notice: Subject to any disclaimer, the term of this patent is extended or adjusted under 35 U.S.C. 154(b) by 61 days.

(21) Appl. No.: 11/181,035

(22) Filed: Jul. 13, 2005

(65) Prior Publication Data

US 2006/0051883 A1 Mar. 9, 2006

Related U.S. Application Data

(60) Provisional application No. 60/587,371, filed on Jul. 13, 2004.

(51) Int. Cl.
*H01S 1/06* (2006.01)
*H03B 17/00* (2006.01)

(52) U.S. Cl. ..................................... 331/94.1
(58) Field of Classification Search .................. 331/3, 331/94.1
See application file for complete search history.

(56) References Cited

U.S. PATENT DOCUMENTS

| 3,450,379 A | 6/1969 | Nolan |
| 3,600,951 A | 8/1971 | Easton |
| 3,735,952 A | 5/1973 | Platus et al. |
| 4,404,459 A | 9/1983 | Harton |
| 4,469,303 A | 9/1984 | Snyder |
| 4,705,982 A | 11/1987 | Besson et al. |
| 4,839,613 A | 6/1989 | Echols et al. |
| 5,006,750 A | 4/1991 | Besson et al. |
| 5,041,800 A | 8/1991 | Long et al. |
| 5,406,682 A | 4/1995 | Zimnicki et al. |
| 5,517,157 A | 5/1996 | English |
| 5,595,430 A | 1/1997 | Weyeneth |
| 5,652,550 A | 7/1997 | Vig |
| 5,657,340 A | 8/1997 | Camparo et al. |
| 5,659,270 A | 8/1997 | Millen et al. |
| 5,686,779 A | 11/1997 | Vig |

(Continued)

FOREIGN PATENT DOCUMENTS

JP 2005-135938 5/2005

OTHER PUBLICATIONS

The Chip-Scale Atomic Clock Coherent Population Trapping vs. Conventional Interrogation, Lutwak et al., Dec. 2002, pp. 1-12.

(Continued)

*Primary Examiner*—David Mis
(74) *Attorney, Agent, or Firm*—Goodwin Procter LLP (57) ABSTRACT

A suspension of a chip-scale device is accomplished using a suspension frame and at least one first tether. The chip-scale suspension frame defines a first plane and an opening through the suspension frame. At least one first tether crosses the opening at a first angle relative to the first plane and can be used to position the chip-scale device at least partially within the opening.

52 Claims, 3 Drawing Sheets

U.S. PATENT DOCUMENTS

| | | | |
|---|---|---|---|
| 5,746,091 | A | 5/1998 | Schaede |
| 5,886,810 | A | 3/1999 | Siahpoushan et al. |
| 5,896,000 | A | 4/1999 | Shniper |
| 5,917,272 | A | 6/1999 | Clark et al. |
| 5,942,794 | A | 8/1999 | Okumura et al. |
| 6,049,256 | A | 4/2000 | Fry |
| 6,208,213 | B1 | 3/2001 | Anastasyev et al. |
| 6,296,779 | B1 | 10/2001 | Clark et al. |
| 6,311,945 | B1 | 11/2001 | D'Angelo |
| 6,326,856 | B1 | 12/2001 | Anderson |
| 6,388,534 | B1 | 5/2002 | Balzano et al. |
| 6,428,713 | B1 | 8/2002 | Christenson et al. |
| 6,559,728 | B1 | 5/2003 | Fry |
| 6,662,655 | B2 | 12/2003 | Foote |
| 6,744,805 | B2 | 6/2004 | Wang et al. |
| 6,759,913 | B2 | 7/2004 | Biernacki |
| 2002/0050167 | A1 | 5/2002 | Foote |
| 2002/0075079 | A1 | 6/2002 | Oblak et al. |
| 2002/0079563 | A1 | 6/2002 | Shimanuki |
| 2002/0113191 | A1 | 8/2002 | Rolt et al. |
| 2002/0163394 | A1 | 11/2002 | Hollberg et al. |
| 2002/0175767 | A1 | 11/2002 | Kitching et al. |
| 2003/0160538 | A1 | 8/2003 | Tomonari et al. |
| 2003/0162322 | A1 | 8/2003 | Chen et al. |
| 2004/0084395 | A1 | 5/2004 | Youngner et al. |
| 2004/0120368 | A1 | 6/2004 | Hayes |
| 2005/0046851 | A1 | 3/2005 | Riley et al. |
| 2006/0051883 | A1* | 3/2006 | Mescher et al. ............... 438/5 |

OTHER PUBLICATIONS

The Chip-Scale Atomic Clock Recent Development Progress, Lutwak et al., Dec. 2003, pp. 1-12.

The Chip-Scale Atomic Clock Low-Power Physics Package, Lutwak et al., Dec. 7-9, 2004, pp. 339-354.

Mems Researches Perfect Fabrication of Atomic Clock, Kelly, M., Aug. 31, 2004, pp. 1-2.

Micro-differential Scanning Calorimeter for Combustible Gas Sensing, Cavicchi et al., 2004, pp. 22-30.

Mems-based Scanning Calorimeter for Thermodynamic Properties of Nanostructures, Allen et al., 1998, pp. 11-19.

High-speed Scanning Microcalorimetry with Monolayer Sensitivity, Lai et al., Aug. 28, 1995, pp. 1229-1231.

Piezoelectric Nano Resonators, Piazza, G., 2003, pp. 1-7.

Microfabricated Alkali Atom Vapor Cells, Applied Physics Letters, vol. 84, No. 14, Liew et al., Apr. 5, 2004, pp. 2694-2696.

The Chip-Scale Atomic Clock Recent Development Progress, 35th Annual Precise Time and Time Interval (PTTI) Meeting, Lutwak R. et al., Dec. 2-4, 2003, pp. 467-478.

Lowering the Cost of Titanium, Hurless, B., The Amptiac Quarterly, vol. 6, No. 2, pp. 1-24.

International Search Report for PCT Application No. PCT/US2005/024879; mailed on Jul. 25, 2006 (4 pgs.).

Jau, Y-Y. et al., "The Physics of Miniature Atomic Clocks: 0-0 versus "End" Resonances", *2003 IEEE International Frequency Control Symposium and PDA Exhibition Jointly with the 17th European Frequency and Time Forum*, 2003 (pp. 33-36).

Kwakernaak, M.H. et al., "Components for Batch-Fabricated Chip-Scale Atomic Clocks", *36th Annual Precise Time and Time Interval (PTTI) Meeting*, 2004 (pp. 355-368).

Mescher, Mark J. et al., "An Ultra-Low-Power Physics Package for a Chip-Scale Atomic Clock," *IEEE Transducers 2005 Conference—The 13th International Conference on Solid-State Sensors, Actuators and Microsystems*, Seoul, Korea, Jun. 5-9, 2005 (pp. 311-316).

Post, A.B. et al., "End Resonances for Atomic Clocks", *35th Annual Precise Time and Time Interval (PTTI) Meeting*, 2003 (pp. 445-456).

Written Opinion of the International Searching Authority for PCT Application No. PCT/US2005/024879; mailed on Jul. 25, 2006 (7 pgs.).

* cited by examiner

APPARATUS AND SYSTEM FOR SUSPENDING A CHIP-SCALE DEVICE AND RELATED METHODS

CROSS-REFERENCE TO RELATED APPLICATION

This application claims priority to and the benefit of, and incorporates herein by reference in its entirety, U.S. Provisional Application Ser. No. 60/587,371, filed on Jul. 13, 2004.

STATEMENT REGARDING FEDERALLY SPONSORED RESEARCH OR DEVELOPMENT

The U.S. Government may have certain rights in this invention as provided for by the terms of Defense Advanced Research Projects Agency (DARPA) Contract No. NBCHC020050.

TECHNICAL FIELD

The invention generally relates to electronic devices and suspension structures therefor. More particularly, the invention relates to an apparatus for suspending a chip-scale device, such as, for example, a chip-scale atomic clock.

BACKGROUND

Many modern electronic applications require an ultra-stable frequency reference and/or an ultra-stable time reference for proper operation. For example, Global Positioning System ("GPS") applications in general, and jam-resistant GPS receivers in particular, devices for wireless network time synchronization, for distributed network communications, and/or for distributed network position localization, and a host of military systems and platforms having sophisticated ultra-high frequency communication and/or navigation requirements all require such references.

Typically, in order to provide the necessary ultra-stable frequency and/or time reference an atomic clock is employed. As readily understood by skilled artisans, an atomic clock is an electronic timing device whose frequency is governed by the natural resonance frequencies of atoms or molecules of suitable elements. Although there are different types of known atomic clocks, the basic principle behind them uses the common property of atoms, set in a suitable environment, to absorb and to emit electromagnetic radiation at one frequency that is extremely stable over time.

The major differences relate to the element used and the means of detecting when the energy level changes. Some types of atomic clocks known in the art include cesium atomic clocks, hydrogen atomic clocks, and rubidium atomic clocks. Cesium clocks employ a beam of cesium atoms, in which cesium atoms of different energy levels are separated by a magnetic field. Hydrogen atomic clocks function in a similar manner, but they require a container with walls of a special material so that the atoms do not lose the high-energy state too rapidly. Rubidium clocks are the simplest and most compact of all atomic clocks and use a glass cell of rubidium gas that changes its light absorption when exposed to the proper microwave frequency.

For proper operation, an atomic clock's temperature needs to be precisely controlled. Preferably, an atomic clock should be kept substantially in thermal isolation, minimizing thermal conductance between components of the atomic clock system, to facilitate its stable operation. In addition, it is also important to provide vibration isolation of the clock, minimizing the relative displacements between its components under acceleration, in order to maintain the clock's mechanical stability.

Over the years, several approaches have been suggested for mounting, as well as for thermally isolating and/or controlling the temperature of an atomic clock. Some techniques employ a bridge made of thermally insulating material to suspend and isolate the clock cell from a substrate. The bridge is fabricated either from the substrate material itself, such as PYREX, or using a material deposited on the substrate, such as silicon nitride. A common feature of these approaches is that the bridge in its nominal configuration is in the plane, or parallel to the plane, of the substrate. Other techniques rely on thermally insulating posts extending from a substrate to support a clock cell and other clock components. In summary, many of known approaches utilize materials that are not of suitably low thermal conductivity and/or emissivity, materials that provide relatively poor heat-sensing sensitivity, and/or materials that are not mechanically robust, as well as suspension geometries that are not sufficiently stiff. Finally, known techniques typically rely on fabrication processes that are not amenable to low-cost parallel production.

Accordingly, there is a need in the art for an apparatus for thermally isolating electronic devices, such as, for example, atomic clocks, with improved mechanical stability and temperature control.

SUMMARY OF THE INVENTION

The present invention generally relates to an apparatus for suspending a chip-scale device, to methods for fabricating such apparatus, and to methods for coupling the chip-scale device to the apparatus. As used herein, a "chip-scale" apparatus or a "chip-scale" device is an apparatus or device whose size is small enough such that it can be readily incorporated into an integrated circuit or chip. For example, it is an apparatus or device whose largest dimension is less than 25 mm.

In various embodiments of the invention, the apparatus is designed to stably suspend, and efficiently control the temperature of, a chip-scale vapor cell unit, thereby enabling fabrication of atomic clock systems that are significantly lower in power consumption than conventional atomic clocks having a similar frequency and/or time reference accuracy, yet which provide adequate mechanical stability. For example, in certain embodiments, the suspension apparatus can securely hold the atomic clock at an operating temperature of approximately 80° C. over an ambient temperature range of approximately 0° C.–50° C. using a maximum temperature control power of approximately 10 mW. Various embodiments of the apparatus disclosed herein, however, are not limited to applications involving chip-scale atomic clocks, but, rather, may also be used to support other low-power chip-scale devices and/or to control their temperatures. For example, the suspension apparatus is suitable for use with quartz resonators, quartz oscillators, miniature resonators, miniature oscillators, gyroscopes, accelerometers, lasers, micro-ovens, and micro-calorimeters.

Generally, in one aspect, the invention features an apparatus for suspending a chip-scale device. The apparatus includes a chip-scale suspension frame and at least one first tether. The chip-scale suspension frame defines a first plane and an opening through the suspension frame. Each first tether extends across the opening at a first angle relative to the first plane and can be used to position the chip-scale device at least partially within the opening defined through the suspension frame.

Various embodiments of this aspect of the invention include the following features. The suspension frame may include a first frame member and a second frame member. The first frame member may be disposed over and substantially parallel to the second frame member. In addition, the suspension frame may further include a spacer disposed between the first frame member and the second frame member.

In many embodiments, the apparatus for suspending the chip-scale device further includes at least one second tether that extends across the opening at a second angle relative to the first plane. The second angle can be different from the first angle. The second angle and/or the first angle can range from about 0 degrees to about 90 degrees, for example, from about 0 degrees to about 60 degrees, preferably from about 0 degrees to about 30 degrees, or, more preferably, from about 0 degrees to about 10 degrees. In some embodiments, vector components of the first and second tethers collectively extend in all three orthogonal directions of a Cartesian coordinate system.

In some embodiments, at least one of the tethers is tensioned to resist compressive stressing. Also, the tethers may resist a relative displacement between the chip-scale device and the suspension frame when the chip-scale device is positioned within the opening. Each first and second tether may couple to and cross the opening of the first frame member or the second frame member. Alternatively, in another embodiment, each first tether couples to and crosses the opening of the first frame member, while each second tether couples to and crosses the opening of the second frame member.

Each first tether can be made from or include a polymer. In some embodiments, the polymer is polyimide. In other embodiments, each first tether comprises a material selected from the group consisting of: polytetrafluoroethylene, B-staged bisbenzocyclobutene-based polymer, poly-paraxylylene-based polymer, epoxy-based photoresist formulated in gamma-Butyrolactone, and epoxy-based photoresist formulated in cyclopentanone. In addition, each first tether may include, for example as a coating, a material having a low heat emissivity. At least one electrical interconnect may also be coupled to each first tether.

In some embodiments, the chip-scale device is or includes a chip-scale atomic clock. In other embodiments, the chip-scale device is or includes one of the following devices: quartz resonators, quartz oscillators, miniature resonators, miniature oscillators, gyroscopes, accelerometers, lasers, micro-ovens, and micro-calorimeters.

Generally, in another aspect, the invention features an atomic clock system. The atomic clock system includes a suspension apparatus and a chip-scale device. The suspension apparatus includes a suspension frame defining an opening therethrough, at least one first tether, and at least one second tether. Each first and second tether crosses the opening of the suspension frame. For its part, the chip-scale device includes a vapor cell unit. The chip-scale device is at least partially positioned within the opening defined through the suspension frame by the at least one first tether and the at least one second tether.

Various embodiments of this aspect of the invention include the following features. Vector components of the tethers may collectively extend in all three orthogonal directions of a Cartesian coordinate system. The tethers may be configured and disposed to resist a relative displacement between the chip-scale device and the chip-scale suspension frame. Moreover, at least one of the tethers may be tensioned to resist compressive stressing. The chip-scale suspension frame may include a first frame member and a second frame member. The first frame member may be disposed over and substantially parallel to the second frame member. In addition, the chip-scale suspension frame may further include a spacer disposed between the first frame member and the second frame member. The largest dimension of the suspension frame desirably does not exceed 15 mm. The vapor cell unit can be coupled to an optical power source or a photodetector device.

In some embodiments, the chip-scale device further includes a temperature sensing element, for example a resistive temperature detector, in communication with the vapor cell unit. Current flowing in a first segment of the temperature sensing element may be balanced against current flowing in an opposite direction in a second segment of the temperature sensing element for the purposes of, for example, minimizing the net magnetic fields generated by the temperature sensing element. In another embodiment, the chip-scale device includes a heating element coupled to the vapor cell unit. The heating element may be, for example, disposed at least partially around the vapor cell unit. As is the case for the temperature sensing element, current flowing in a first segment of the heating element may be balanced against current flowing in an opposite direction in a second segment of the heating element. Again, this may be for the purposes of minimizing the net magnetic fields generated by the heating element.

In other embodiments, the optical power source includes a laser element, for example a vertical-cavity surface-emitting laser, at least partially positioned within the opening below the vapor cell unit. In still another embodiment, the chip-scale device includes the photodetector, such as, for example, a photodiode, in communication with the optical power source.

In general, in yet another aspect, the invention features a method for fabricating an atomic clock system. The method includes fabricating a first frame member and a plurality of first tethers coupled thereto, and coupling a chip-scale unit to the plurality of first tethers. The first frame member is fabricated to define a first plane and a first opening through the first frame member, white the plurality of first tethers coupled to the first frame member are fabricated to cross the opening and to initially lie substantially in the first plane. In coupling the chip-scale unit to the first tethers, the first tethers can be caused to extend at an angle relative to the first plane ranging from above 0 degrees to about 90 degrees, or from above 0 degrees to about 30 degrees.

In many embodiments of this aspect of the invention, the method further includes fabricating a second frame member and a plurality of second tethers coupled thereto, and coupling the chip-scale unit to the second tethers. In such embodiments, the second frame member is fabricated to define a second plane and a second opening through the second frame member, while the second tethers coupled to the second frame member are fabricated to cross the opening of the second frame member and to initially tie substantially in the second plane. In coupling the chip-scale unit to the second tethers, the second tethers can be caused to extend from the second frame member at an angle relative to the second plane, ranging from above 0 degrees to about 90 degrees, or from above 0 degrees to about 30 degrees. In a particular embodiment, coupling of the chip-scale unit to the second tethers occurs substantially simultaneously with coupling of the chip-scale unit to the first tethers.

In another embodiment of this aspect of the invention, the method further includes spacing the first frame member from the second frame member, such that the first plane is substantially parallel to the second plane and is separated by a first distance. In one such embodiment, the chip-scale unit has a length greater than the first distance.

The first frame member and the plurality of first tethers coupled thereto may be fabricated using planar fabrication techniques. In addition, the plurality of first tethers may be tensioned to resist compressive stressing.

These and other objects, along with advantages and features of the present invention herein disclosed, will become apparent through reference to the following description, the accompanying drawings, and the claims. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

As mentioned above, the present invention relates to an apparatus for suspending a chip-scale device, such as, for example, an atomic clock, and to methods for fabricating an atomic clock system. In broad overview, in accordance with one embodiment of the invention, the suspension apparatus includes a suspension frame having a first frame member (e.g., a top frame member) that defines a first plane and a second frame member (e.g., a bottom frame member) that defines a second plane. The first frame member may be disposed over and substantially parallel to the second frame member, such that the first plane is substantially parallel to the second plane. In addition, an opening may be defined through the suspension frame.

In accordance with various embodiments of the invention, either the first frame member, the second frame member, or both the first frame member and the second frame member include at least one tether for positioning (e.g., suspending) the chip-scale device at least partially within the opening defined through the suspension frame. For example, in some embodiments, the first frame member includes one or more tethers that extend inwardly from the suspension frame (i.e., that cross the opening) at a first angle relative to the first plane and the second frame member includes one or more tether that cross the opening at a second angle relative to the second plane. In certain embodiments, the tethers extending from the first frame member may form different angles with respect to the first plane. Also, the tethers extending from the second frame member may form different angles with respect to the second plane.

In some embodiments, the first and second tethers lie in the first and second planes, respectively. In other embodiments, by extending the first tether at a first angle relative to the first plane and/or by extending the second tether at a second angle relative to the second plane, rather than having the first and/or second tethers lie in the first and second planes, respectively, the vibration resistance and, as a result, mechanical stability of the suspension apparatus is improved. In particular, in these embodiments, in the face of external factors such as, for example, accelerated movement or vibration of the system due to a surrounding magnetic field, the tethers are positioned and configured to resist a relative displacement between the chip-scale device and the suspension frame when the chip-scale device is positioned within the opening defined through the suspension frame. In many embodiments, the tethers are also designed to resist compressive stresses applied thereto.

Figure 1:
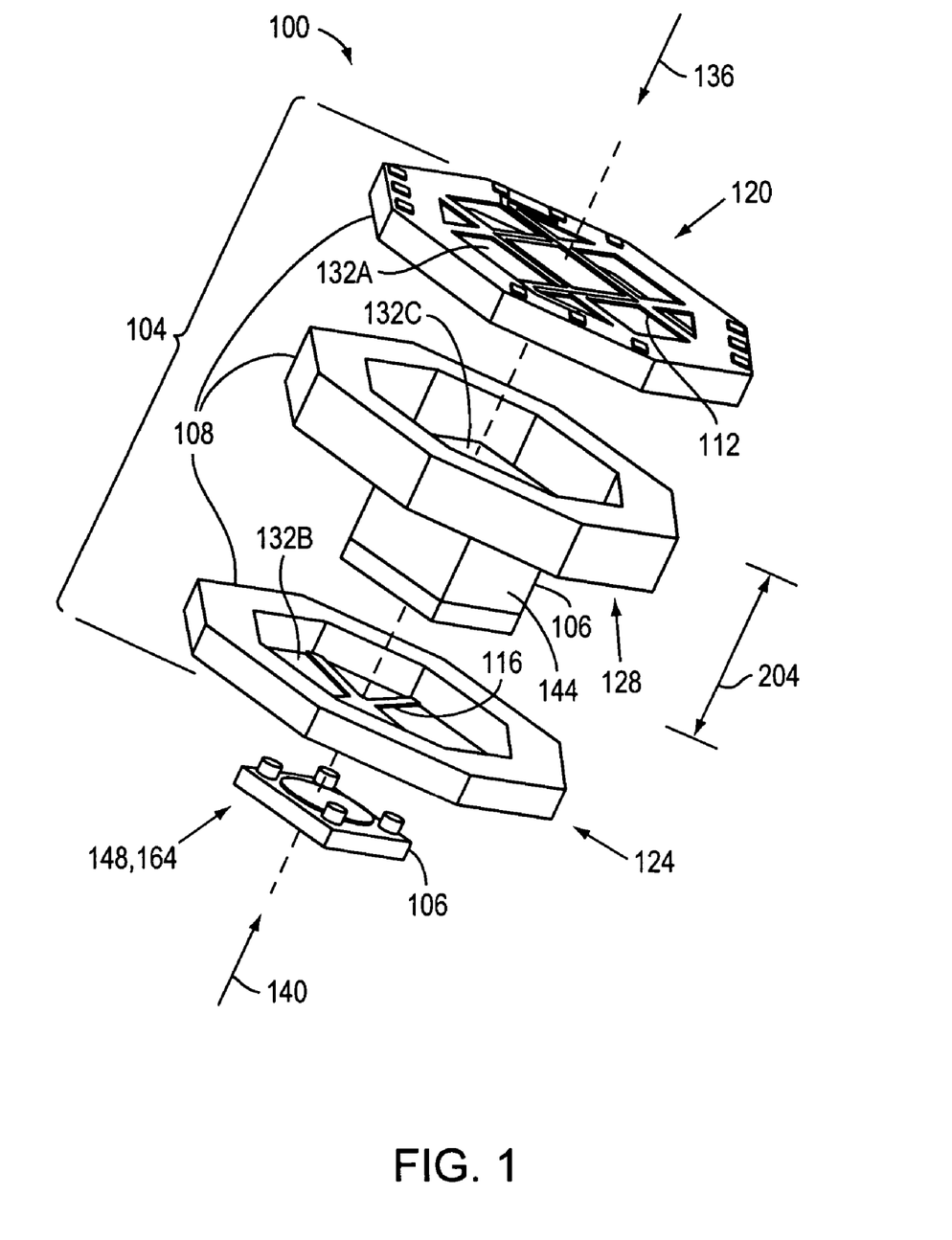
FIG. 1 is a schematic exploded perspective view of an atomic clock system in accordance with one embodiment of the invention.

FIG. 1 depicts an atomic clock system 100 according to an illustrative embodiment of the invention. The atomic clock system 100 includes a suspension apparatus 104 for suspending a chip-scale device 106. In various embodiments, the suspension apparatus 104 includes a suspension frame 108, which may itself be dimensioned on a chip scale, at least one first tether 112, and at least one second tether 116. Components of the chip-scale suspension frame 108 may include a first frame member 120 to which the one or more first tethers 112 may be coupled, a second frame member 124 to which the one or more second tethers 116 may be coupled, and a spacer 128 disposed between the first frame member 120 and the second frame member 124 for spacing the first frame member 120 from the second frame member 124. In many embodiments, the tethers are integrally formed with the frame members, as discussed in more detail below. An opening 132, including an opening 132A through the first frame 120, an opening 132B through the second frame member 124, and an opening 132C through the spacer 128, may be defined through the suspension frame 108 in the direction of arrows 136, 140.

Figure 2:
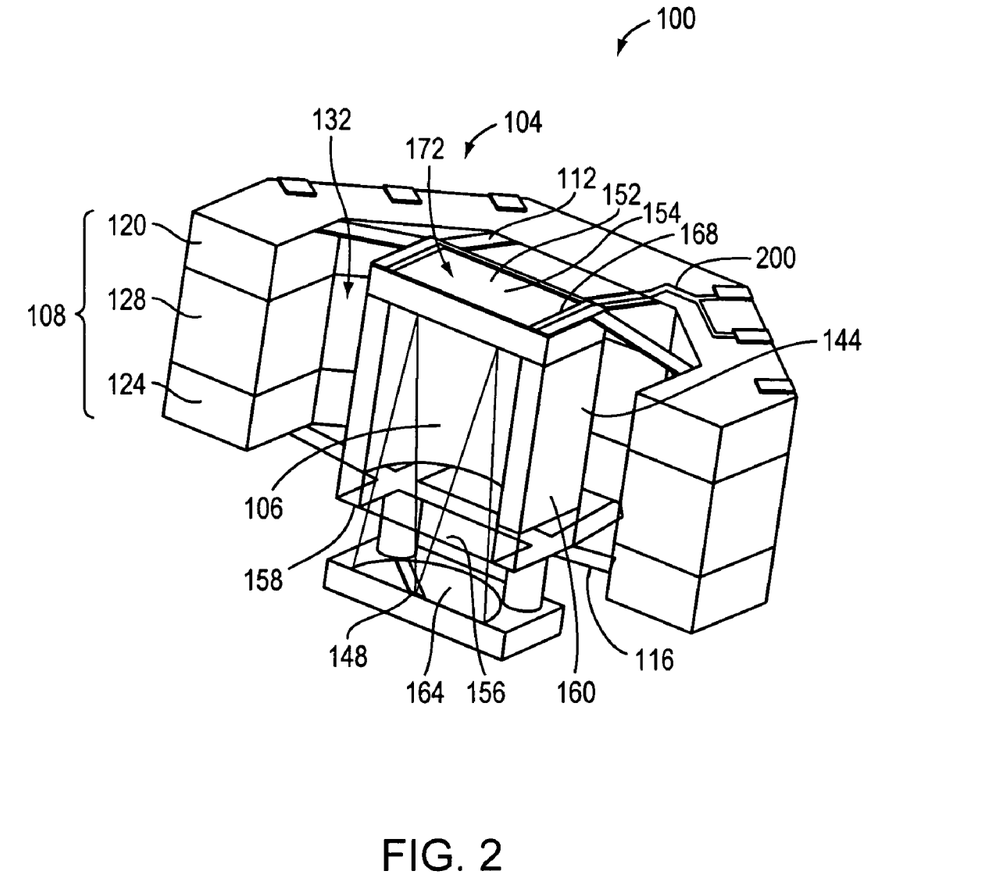
FIG. 2 is a schematic cross-sectional perspective view of the atomic clock system of FIG. 1 in accordance with another embodiment of the invention.

FIG. 2 depicts a schematic cross-sectional perspective view of the atomic clock system 100. As shown, the chip-scale device 106 may be positioned at least partially within the opening 132 by the first tether(s) 112 and the second tether(s) 116. In one embodiment, the chip-scale device 106 is a chip-scale atomic clock. It should be understood, however, that the suspension apparatus 104 described herein may be used to support other chip-scale devices, such as, for example, quartz resonators, quartz oscillators, miniature resonators, miniature oscillators, gyroscopes, accelerometers, lasers, micro-ovens, and micro-calorimeters. In other words, the suspension apparatus 104 is not limited to supporting only an atomic clock and may be used in connection with systems other than the atomic clock system 100.

Referring still to FIG. 2, in those embodiments where the chip-scale device 106 is an atomic clock, the device 106 may include a hollow vapor cell unit 144 coupled to an optical power source 148 or a photodetector device 164. In one embodiment, the vapor cell 144 is a rectangular housing that includes a first endcap 152 at a first end 154, a second translucent endcap 156 at a second opposing end 158, and four sidewalls 160 between the first and second end caps 152, 156. In one such embodiment, the vapor cell 144 is integrated with, and is in good thermal contact with, the optical power source 148. For example, the optical power source 148 may be a laser element disposed, as illustrated in FIG. 2, in the opening below the vapor cell unit 144 (i.e., below the second translucent endcap 156 of the vapor cell unit 144). In one particular embodiment, the laser element is a vertical-cavity surface-emitting laser ("VCSEL"). The chip-scale device 106 may also include, as the photodetector 164, a photodiode 164 in communication with the optical power source 148. In addition, a mirror (not shown) may be located at the first end 154 of the vapor cell unit 144 on the interior surface of the first end cap 152.

In some embodiments, the hollow vapor cell unit 144 contains an active medium such as, for example, a cesium vapor, which readily absorbs light having a center frequency of approximately 4.6 GHz. In operation, the cesium vapor is irradiated with light from the optical power source 148. If the center frequency of the light emitted by the optical power source 148 varies from 4.6 GHz, the light will traverse the vapor cell unit 144 from its second end 158 to its first end 154, will be reflected by the mirror at the first end 154, and will return to the second end 158 of the vapor cell unit 144 where it will be detected by the photodetector 164. If, however, the center frequency of the light emitted by the optical power source 148 does not vary from 4.6 GHz, the light will be readily absorbed by the cesium vapor and no such light will be detected at the photodetector 164.

Accordingly, if the photodetector 164 senses light, the optical power source 148 is not continuously emitting light at a center frequency of 4.6 GHz and a signal can be sent from the photodetector 164 to the optical power source 148, either directly or indirectly through other electronic control circuitry (not shown), to modify the center frequency of the light being emitted therefrom. If, however, the photodetector 164 does not sense any returned light, the optical power source 148 is continuously emitting light at a center frequency of 4.6 GHz, and a stable frequency reference for an atomic clock has been achieved.

One skilled in the art will readily recognize that modifications may be made to this atomic clock without departing from the spirit and the scope of the invention. For example, a rubidium vapor as opposed to a cesium vapor can be used as the active medium within the vapor cell unit 144. As another example, the photodetector 164 can be placed at the first end 154 of the vapor cell unit and the mirror removed. Other modifications are also possible.

Both the nominal output wavelength of the optical power source 148 and the optical absorptive properties of the vapor within the vapor cell unit 144 may vary with temperature fluctuations. Thus, in accordance with an embodiment of the present invention, the temperature of both the optical power source 148 and the vapor cell unit 144 is accurately controlled and regulated. In a particular embodiment, the optical power source 148 and the vapor cell unit 144 are maintained at substantially the same temperature. To control the temperature of both the optical power source 148 and the vapor cell unit 144, the chip-scale device 106 further includes a heating element 168 coupled to the vapor cell unit 144 and a temperature sensing element 172 in communication with the vapor cell unit 144. In certain embodiments, the first endcap 152 is constructed of a poor thermal conductor, while the hollow vapor cell unit 144 is constructed of a good thermal conductor, such as, for example, silicon. In these embodiments, the heating element 168 is disposed at least partially around the vapor cell unit 144, for example around the periphery of the first endcap 152 as illustrated in FIG. 2, to provide heat in the areas where it can be most uniformly distributed, thereby resulting in a more uniform temperature of the vapor cell unit 144. Moreover, in such embodiments, to provide a good estimate of the average temperature of the vapor cell unit 144, the temperature sensing element 172 is distributed over the first endcap 152.

In operation, the temperature sensing element 172 senses the temperature of the vapor cell unit 144 and sends a signal indicative of this temperature to electronic control circuitry (not shown). In response to the signal received from the temperature sensing element 172, the electronic control circuitry sends a signal to the heating element 168 to control the amount of heat generated thereat. In some embodiments, the temperature sensing element 172 is designed so that any current flowing in a first segment of the temperature sensing element 172 is balanced against current flowing in an opposite direction in a second segment of the temperature sensing element 172. Such a design minimizes the magnetic field generated by the temperature sensing element 172 in the vicinity of the vapor cell unit 144. Similarly, to minimize the magnetic field generated by the heating element 168 in the vicinity of the vapor cell unit 144, the heating element 168 may in another embodiment be designed so that any current flowing in a first segment of the heating element 168 is balanced against current flowing in an opposite direction in a second segment of the heating element 168.

To minimize the amount of heat lost through conduction or convection, a vacuum packaging (not shown) may be used to house the atomic clock system 100. In addition, to minimize the amount of heat lost through radiation, in various embodiments, the surface area of the atomic clock system 100 is made very small. For example, as described herein, the atomic clock system 100 is a chip-scale system that includes a suspension frame 104 and a chip-scale device 106. Moreover, to further minimize the amount of heat lost through radiation, the vapor cell unit 144, the vacuum packaging, and/or the tethers 112, 116 may be coated with a material having a low heat emissivity, such as, for example, aluminum.

To further minimize the heat lost from the atomic system 100, the tethers 112, 116 may be constructed to be thermal insulators. In one embodiment, this is achieved by fabricating the tethers to be long and thin (i.e., small in cross-section). Additionally, the tethers may be constructed of a material having a low thermal conductivity. For example, the tethers may be constructed of a polymer, such as polyimide, which has a thermal conductivity of less than 0.2 W/m° C. Other materials that may be used to construct the tethers include, for example,

- polyimide-like materials with proprietary additives (e.g., KAPTON (available from the E.I. Du Pont De Nemours and Company Corporation of Wilmington, Del. ("Du Pont"))),
- polytetrafluoroethylene polymer, e.g. TEFLON (also available from Du Pont),
- B-staged bisbenzocyclobutene-based polymer, e.g. CYCLOTENE (available from the Dow Chemical Company of Midland, Mich.),
- poly-paraxylylene-based polymer, e.g. PARYLENE (available from Specialty Coating Systems, Inc. of Indianapolis, Ind.), and
- epoxy-based photoresist formulated in gamma-Butyrolactone or cyclopentanone, e.g. SU-8 (available from by MicroChem Corporation of Newton, Mass.).

Thus, one or more of the above-described embodiments, for example all of the above-described embodiments in combination, are used to maintain the vapor cell unit 144 and the optical power source 148 at a relatively constant temperature above ambient using minimal power.

Figure 3:
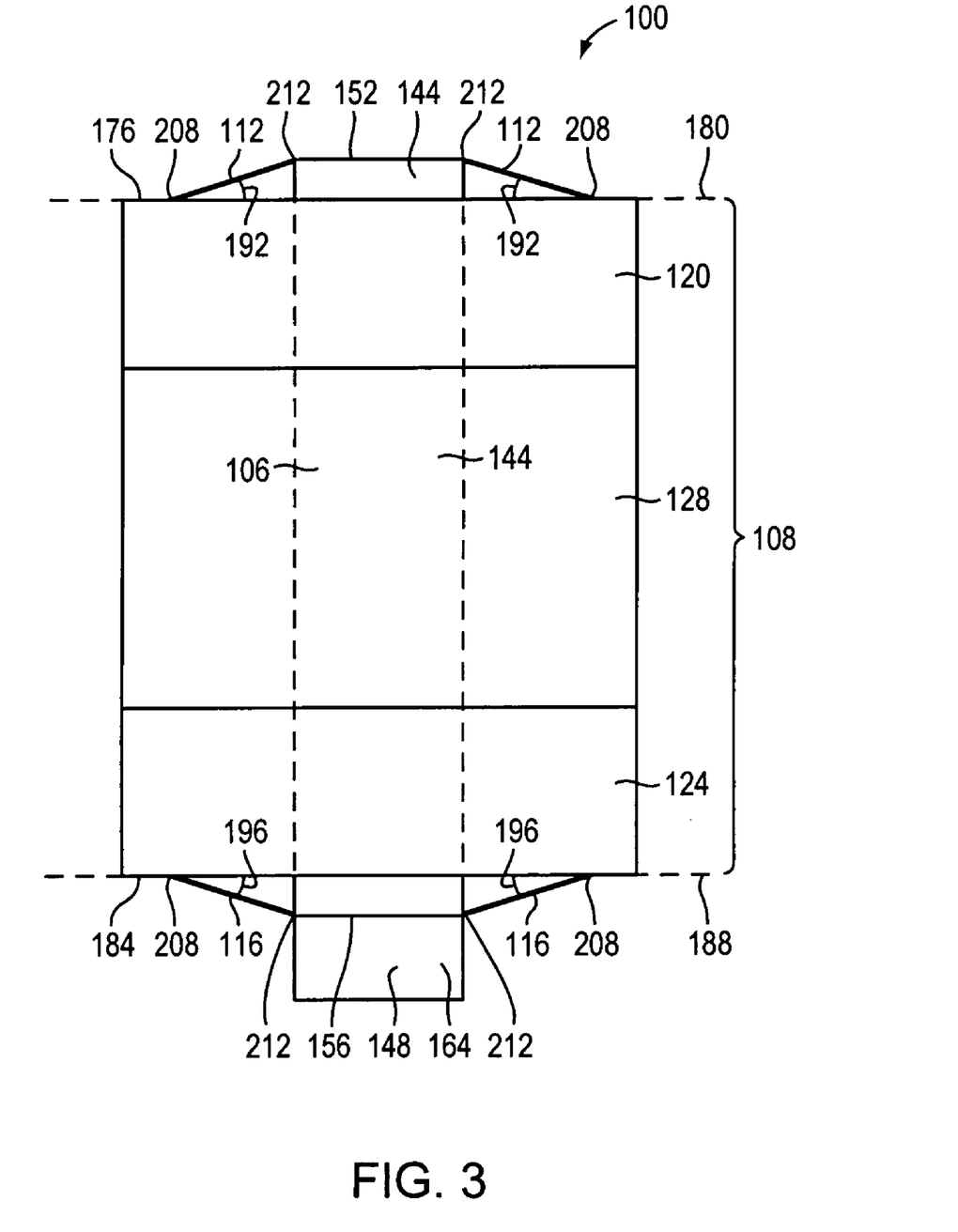
FIG. 3 is a schematic side view of the atomic clock system of FIG. 1 in accordance with yet another embodiment of the invention.

FIG. 3 depicts a side view of the atomic clock system 100. As illustrated in FIG. 3, a top surface 176 of the first frame member 120 defines a first plane 180 (i.e., a plane that is substantially parallel to the top surface 176), and a bottom surface 184 of the second frame member 124 defines a second plane 188 (i.e., a plane that is substantially parallel to the bottom surface 184). As also illustrated in FIG. 3, the first frame member 120 is disposed over and substantially parallel to the second frame member 124, such that the first plane 180 is substantially parallel to the second plane 188. In addition, the first and second planes 180, 188 may be substantially parallel to the surfaces of the vapor cell unit's end caps 152, 156, and substantially parallel to the surface of the substrate (not shown) with which the atomic clock system 100 is integrated.

Referring now to both FIGS. 2 and 3, as mentioned above, in various embodiments, the chip-scale device 106 is tethered to the suspension frame 108. In particular, at least one first tether 112 positions the chip-scale device 106 at least partially within the opening 132. Optionally, as illustrated, at least one second tether 116 may also position the chip-scale device 106 within the opening 132.

In addition to providing positioning for the chip-scale device 106 within the opening 132, the first and second tethers 112, 116 are also designed to provide stability and vibration isolation to the chip-scale device in the face of, for example, large accelerations (e.g., high g-force loads) and vibrations. As described above, the tethers are constructed to be long and thin so as not to conduct an excessive amount of heat away from the chip-scale device in order that the chip-scale device may be maintained at a relatively constant temperature above ambient using minimal power. In addition, in order to provide mechanical stability and vibration isolation, with reference to FIG. 3, one or more tethers 112 have been designed to extend inwardly from the first frame member 120 of the suspension frame 108 at a first angle 192 relative to the first plane 180, and tethers 116 have been designed to extend inwardly from the second frame member 124 of the suspension frame 108 at a second angle 196 relative to the second plane 188. In some embodiments, the angle 192 is the same for all tethers 112. In other embodiments, the angle 192 is different at least some of the tethers. For example, in a particular embodiment, there are two sets of tethers 112, with the angle 192 being the same within each set, but different between the sets. Similarly, in some embodiments, the angle 196 is the same for all tethers 116. In other embodiments, the angle 196 is different at least some of the tethers 116. For example, in a particular embodiment, there are two sets of tethers 116, with the angle 196 being the same within each set, but different between the sets.

By designing the first and second tethers 112, 116 so that they do not lie in the first and second planes 180, 188, the stiffness of the tethers 112, 116 is increased, as are the tethers 112, 116 ability to provide stability to the chip-scale device 106 in the presence of large accelerations. More particularly, with the tethers 112, 116 extended at an angle 192, 196 to the first and second planes 180, 188, net forces applied to the atomic clock system 100 are transmitted by the tethers 112, 116 to the other components of the atomic clock system 100 through tensile stresses rather than bending stresses.

In one particular embodiment, as further described below, the first and/or second tethers 112, 116 are initially constructed to lie in the first and/or second plane 180, 188 and are then bent to extend at a first and/or second angle 192, 196 to the first and/or second plane 180, 188. By doing so, the first and/or second tethers 112, 116 are naturally tensioned to resist compressive stressing. In addition, by doing so, the first and/or second tethers 112, 116 are configured and disposed to resist a relative displacement between the chip-scale device and the suspension frame 108, which advantageously minimizes possibility of a physical damage to any of the components of the atomic clock system 100.

The set of first tethers 112, the set of second tethers 116, or the set of both first tethers 112 and second tethers 116 may be configured such that the length axes of the tethers (along which the tension forces are transmitted) collectively have vector components that extend in all three orthogonal directions of a Cartesian coordinate system. In such a fashion, the combined configuration of the first tethers and/or the second tethers can provide resistance to forces of acceleration in all possible directions (i.e., +x, −x, +y, −y, +z, −z, or combinations thereof).

In various embodiments of the invention, electrical interconnects 200 (see FIG. 2) are coupled to some of the first and/or second tethers 112, 116 to interconnect the electronic control circuitry (not shown) with the optical power source 148, the photodetector 164, the heating element 168, and the temperature sensing element 172, such as, for example, a resistive temperature detector. In such a fashion, the electronic control circuitry may transmit a drive signal to the optical power source, current or other electrical signals required to interrogate the photodetector to the photodetector, current to the heating element, and current or other electrical signals required to interrogate the temperature sensing element to the temperature sensing element. In addition, the electrical interconnects allow the photodetector 164 and the temperature sensing element 172 to send responsive signals to the electronic control circuitry.

In some embodiments, the electrical interconnects 200 are directly attached to (i.e., integrated onto) the first and/or second tethers 112, 116. For example, the electrical interconnects may be directly deposited and patterned onto the first and/or second tethers. Methods for doing so include sputtering, evaporation, and electroplating, or any conventional deposition methods known in the art.

In a particular embodiment, the electrical interconnects 200 are fabricated from a combination of titanium and platinum. More specifically, titanium is first provided as a base layer (i.e., as a sticking layer) on the first and/or second tethers 112, 116, and a layer of platinum is then added thereto. Because platinum has a low strain yield, gold may be used in place of platinum for the electrical interconnects at those points of the electrical interconnects requiring a high strain yield, namely at a connection point 208 (see FIG. 3) between the first and/or second tethers 112, 116 and the chip-scale suspension frame 108 (i.e., a first inflexion point for the electrical interconnects) and at a connection point 212 (see FIG. 3) between the first and/or second tethers 112, 116 and the vapor cell unit 144 (i.e., a second inflexion point for the electrical interconnects). Because gold is more thermally conductive than platinum, however, its use in the electrical interconnects is limited to these inflexion points in order to minimize the amount of heat lost through conduction.

In another aspect, the invention relates to methods for fabricating the atomic clock system 100. In accordance with this aspect of the invention, the first frame member 120 and a plurality of first tethers 112 coupled thereto, as well as the second frame member 124 and a plurality of second tethers 116 coupled thereto, are fabricated using planar fabrication techniques. More specifically, the first frame member and the plurality of first tethers coupled thereto are fabricated such that the first tethers cross the opening 132A to lie substantially in the first plane 180 defined by the top surface 176 of the first frame member 120. Similarly, the second frame member 124 and the plurality of second tethers 116 coupled thereto are fabricated such that the second tethers 116 cross the opening 132B to lie substantially in the second plane 188 defined by the bottom surface 184 of the second frame member 124.

Fabricating the first frame member 120 and the plurality of first tethers 112 coupled thereto and the second frame member 124 and the plurality of second tethers 116 coupled thereto using the planar fabrication techniques may be achieved by using a spin-on version of polyimide that is photodefinable, as is described below. As illustrated in FIG. 1, the above-described fabrication techniques result in the first frame member 120 defining the first opening 132A therethrough and the second frame member 124 defining the second opening 132B therethrough. One particular implementation of this fabrication technique is described in more detail below.

Once the first and second frame members 120, 124 are fabricated as just described, the chip-scale device 106 is coupled to the plurality of first and second tethers 112, 116. In one embodiment, referring again to FIG. 1, the vapor cell unit 144 of the chip-scale device 106 is first placed within an opening 132C of the spacer 128. The first and second frame members 120, 124 are then oriented on opposite sides of the spacer 128, such that the first plane 180 is substantially parallel to the second plane 188. The first and second frame members are then moved towards one another in the direction of arrows 136, 140 until the first and second frame members abut the spacer. The first and second frame members may then be attached to the spacer by, for example, bonding the first and second frame members to the spacer with, for example, an epoxy glue. In such a fashion, the first frame member 120 is spaced from the second frame member 124 by a first distance.

In one embodiment, the spacer 128 and the vapor cell unit 144 of the chip-scale device 106 are chosen so that the vapor cell unit has a length 204 (see FIG. 1) greater than the aforementioned first distance spacing the first frame member 120 from the second frame member 124. As a result, in the process of moving the first frame member towards the second frame member and attaching each frame member to the spacer, as described above, the vapor cell unit 144 causes the plurality of first and second tethers 112, 116 to be deflected from the first and second planes 180, 188, respectively, such that the plurality of first tethers extend inwardly from the first frame member at a first angle 192 relative to the first plane and the plurality of second tethers extend inwardly from the second frame member at a second angle 196 relative to the second plane 188, as illustrated in FIG. 3. An adhesive, such as, for example, an epoxy glue, may be used to bond the first and second tethers 112, 116 to the vapor cell unit 144 of the chip-scale device 106, and the optical power source 148/photodetector 164 pair may be connected to the vapor cell unit. It should be noted that polyimide, because it has a high strain yield (typically 3%) and can be stretched by a large amount relative to other low-thermal-conductivity materials such as silicon nitride or oxide, is as a particularly good choice of material for the first and second tethers 112, 116, which must be bent from their originally planar configurations as described above.

In one a particular embodiment, the first and second frame members 120, 124 of the suspension frame 108 are fabricated on separate silicon wafers. The frame spacer 128 is machined from aluminum using conventional metal processing techniques. The patterned polyimide layers that form the suspension tethers 112, 116 are identical except that the second frame member 124 allows for optical transmission of the optical power source 148 and collected light. The process sequences are identical for both frame members 120, 124 except for the metallization step, as outlined below:

(1) Grow etch stop having a thickness of about 1 µm for backside silicon etch using $SiO_2$;
(2) Spin on a photodefined polyimide layer having a thickness of 5 µm as a structural material for the suspension tethers;
(3) Perform a soft-bake step;
(4) Perform a patterned photoexposure of the polyimide;
(5) Perform a polyimide development step to dissolve patterned portions of the polyimide, thereby forming the tethers;
(6) Cure the polyimide to crosslink the polyimide polymer;
(7) Sputter titanium layer having a thickness of about 0.04 µm to protect polyimide during subsequent photolithography steps;
(8) Spin/expose/develop photoresist for metallization;
(9) (A) For the first frame member 120 only:
Sputter metal layers for thermal control suspension—Ti (0.03 µm) and Pt (0.25 µm)
(B) For the second frame member 124 only:
Sputter suspension metal layers for the optical power source and photodetector: Ti (0.03 µm), Pt(0.40 µm), Au(0.40 µm), and Ti (0.10 µm)
(10) Perform solvent liftoff for metal patterning;
(11) Spin/expose/develop photoresist for metallization;
(12) Sputter bond pad metal layers—Ti (0.03 µm) and Au (0.5 µm);
(13) Perform Solvent liftoff for metal patterning;
(14) Etch protective titanium layer;
(15) Spin/expose/develop photoresist for Si etch pattern;
(16) Etch Si (DRIE) for suspension release through wafer (500 µm); and
(17) Plasma-etch thermal oxide etch-stop layer.

Subsequently, the vapor cell unit 144 and suspension structures are assembled with epoxy. EPO-TEK 353ND is suitable for such purpose, in part because of its optical transmission characteristics and low outgassing properties. The vapor cell unit 144 is first mounted to the first frame member 120 using the first tethers 112. More specifically, the first frame member 120 is placed face-down in an alignment fixture. The vapor cell unit 144 is then mounted mirror-side down to the first tethers 112 of the frame member 120 via manual dispensing of epoxy. After curing, the adhesive interface thickness is 5 µm. The aluminum frame spacer 128 is then aligned via fiducial marks and adhered to the first frame member 120. Finally the second frame member 124 is aligned using another fiducial mark on the second frame member 124. Epoxy is used to attach the second tethers 116 to the cell unit 144 and the second frame member 124 to the frame spacer 128.

The optical power source 148 and/or photodetector 164 die is attached to the cell unit 144 via solder reflow. Specifically, solder balls between approximately 0.008 inches and 0.025 inches in size are first attached to the optical power source 148 and/or photodetector 164 pads. The solder balls are then aligned to pad locations on the second tethers 116 and attached by reflowing the solder. Simultaneously, solder balls are attached to pads on the second frame member 124 to enable mounting of the second frame member 124 to a ceramic leadless chip carrier ("LCC"). The LCC is then aligned and a final reflow done to connect the second frame member 124 to the LCC. The heater element 168 and temperature sensing element 172 are connected via wire bond to corner pads in the LCC. Finally, an alumina lid, containing an activated getter, is attached in vacuum. A solder preform is mounted onto the seat-ring of the LCC and reflowed to seal the device. Including the vacuum package, the overall size of the physics package is approximately 0.6 cm³.

Having described certain embodiments of the invention, it will be apparent to those of ordinary skill in the art that other embodiments incorporating the concepts disclosed herein may be used without departing from the spirit and scope of the invention. For example, thin polymer membranes can be used to secure the chip-scale device 106 within the opening 132 in the suspension frame 108 in lieu of tethers 112, 116. Accordingly, the described embodiments are to be considered in all respects as only illustrative and not restrictive.

What is claimed is:

1. An apparatus for suspending a chip-scale device, the apparatus comprising:
    a chip-scale suspension frame defining a first plane and an opening through the suspension frame; and
    at least one first tether for positioning the chip-scale device at least partially within the opening, the at least one first tether extending across the opening at a first angle relative to the first plane.

2. The apparatus of claim 1, further comprising at least one second tether for positioning the chip-scale device at least partially within the opening, the at least one second tether extending across the opening at a second angle relative to the first plane.

3. The apparatus of claim 2 wherein the second angle is different from the first angle.

4. The apparatus of claim 2 wherein at least one of the second angle and the first angle ranges from about 0 degrees to about 90 degrees.

5. The apparatus of claim 4 wherein at least one of the second angle and the first angle ranges from about 0 degrees to about 60 degrees.

6. The apparatus of claim 5 wherein at least one of the second angle and the first angle ranges from about 0 degrees to about 30 degrees.

7. The apparatus of claim 6 wherein at least one of the second angle and the first angle ranges from about 0 degrees to about 10 degrees.

8. The apparatus of claim 2 wherein vector components of the first and second tethers collectively extend in all three orthogonal directions of a Cartesian coordinate system.

9. The apparatus of claim 2 wherein at least one of the tethers is tensioned to resist compressive stressing.

10. The apparatus of claim 9 wherein the at least one first tether and the at least one second tether resist a relative displacement between the chip-scale device and the chip-scale suspension frame when the chip-scale device is positioned within the opening.

11. The apparatus of claim 1 wherein the at least one first tether comprises a material having a low heat emissivity.

12. The apparatus of claim 1 wherein the at least one first tether comprises a polymer.

13. The apparatus of claim 12 wherein the at least one first tether comprises polyimide.

14. The apparatus of claim 1 wherein the at least one first tether comprises a material selected from the group consisting of: polytetrafluoroethylene, B-staged bisbenzocyclobutene-based polymer, poly-paraxylylene-based polymer, epoxy-based photoresist formulated in gamma-Butyrolactone, and epoxy-based photoresist formulated in cyclopentanone.

15. The apparatus of claim 1, further comprising at least one electrical interconnect coupled to the at least one first tether.

16. The apparatus of claim 15 wherein the at least one electrical interconnect is at least partially supported by the at least one first tether.

17. The apparatus of claim 1 wherein the chip-scale suspension frame comprises:
    a first frame member; and
    a second frame member, the first frame member being disposed over and substantially parallel to the second frame member.

18. The apparatus of claim 17 wherein the chip-scale suspension frame further comprises a spacer disposed between the first frame member and the second frame member.

19. The apparatus of claim 1 wherein the chip-scale device comprises a chip-scale atomic clock.

20. The apparatus of claim 1 wherein the chip-scale device is selected from the group consisting of: quartz resonators, quartz oscillators, miniature resonators, miniature oscillators, gyroscopes, accelerometers, lasers, micro-ovens, and micro-calorimeters.

21. An atomic clock system, comprising:
    a suspension apparatus, comprising:
        a suspension frame defining an opening therethrough; and
        at least one first tether and at least one second tether, the at least one first and second tethers extending across the opening; and
    a chip-scale device at least partially positioned within the opening by the at least one first tether and the at least one second tether, the device comprising a vapor cell unit.

22. The system of claim 21 wherein the largest dimension of the suspension frame does not exceed 15 mm.

23. The system of claim 21 wherein vector components of the tethers collectively extend in all three orthogonal directions of a Cartesian coordinate system.

24. The system of claim 21 wherein the vapor cell unit is coupled to an optical power source.

25. The system of claim 24 wherein the optical power source comprises a laser element.

26. The system of claim 25 wherein the laser element is at least partially positioned within the opening below the vapor cell unit.

27. The system of claim 25 wherein the laser element is a vertical-cavity surface-emitting laser.

28. The system of claim 24 wherein the chip-scale device further comprises a photodetector in communication with the optical power source.

29. The system of claim 28 wherein the photodetector comprises a photodiode.

30. The system of claim 21 wherein the tethers are configured and disposed to resist a relative displacement between the chip-scale device and the suspension frame.

31. The system of claim 21 wherein at least one of the tethers is tensioned to resist compressive stressing.

32. The system of claim 21 wherein the chip-scale device further comprises at least one temperature sensing element in communication with the vapor cell unit.

33. The system of claim 32 wherein the temperature sensing element comprises a resistive temperature detector.

34. The system of claim 32 wherein current flowing in a first segment of the temperature sensing element is balanced against current flowing in an opposite direction in a second segment of the temperature sensing element.

35. The system of claim 21 wherein the chip-scale device further comprises at least one heating element coupled to the vapor cell unit.

36. The system of claim 35 wherein the at least one heating element is disposed at least partially around the vapor cell unit.

37. The system of claim 35 wherein an electric current flowing in a first segment of the heating element is balanced against an electric current flowing in an opposite direction in a second segment of the heating element.

38. The system of claim 21 wherein the suspension frame comprises:

a first frame member; and a second frame member, the first frame member being disposed over and substantially parallel to the second frame member.

39. The system of claim 38 wherein the suspension frame further comprises a spacer disposed between the first frame member and the second frame member.

40. A method for fabricating an atomic clock system, the method comprising:

fabricating a first frame member and a plurality of first tethers coupled thereto, the first frame member defining a first plane and a first opening through the first frame member, the plurality of first tethers extending across the first opening and lying substantially in the first plane; and coupling a chip-scale unit to the plurality of first tethers.

41. The method of claim 40 wherein, following coupling of the chip-scale unit to the plurality of first tethers, the plurality of first tethers extend across the first opening at a first angle relative to the first plane.

42. The method of claim 41 wherein the first angle ranges from above 0 degrees to about 90 degrees.

43. The method of claim 42 wherein the first angle ranges from above 0 degrees to about 30 degrees.

44. The method of claim 40, further comprising:

fabricating a second frame member and a plurality of second tethers coupled thereto, the second frame member defining a second plane and a second opening through the second frame member, the plurality of second tethers extending across the second opening and lying substantially in the second plane; and coupling the chip-scale unit to the plurality of second tethers.

45. The method of claim 44 wherein, following coupling of the chip-scale unit to the plurality of second tethers, the plurality of second tethers extend across the second opening at a second angle relative to the second plane.

46. The method of claim 45 wherein the second angle ranges from above 0 degrees to about 90 degrees.

47. The method of claim 46 wherein the second angle ranges from above 0 degrees to about 30 degrees.

48. The method of claim 44 wherein coupling of the chip-scale unit to the plurality of second tethers occurs substantially simultaneously with coupling of the chip-scale unit to the plurality of first tethers.

49. The method of claim 44, further comprising spacing the first frame member from the second frame member, such that the first plane is substantially parallel to the second plane and separated by a first distance.

50. The method of claim 49 wherein the chip-scale unit has a length greater than the first distance.

51. The method of claim 40 wherein the first frame member and the plurality of first tethers coupled thereto are fabricated using planar fabrication techniques.

52. The method of claim 40 wherein the plurality of first tethers are tensioned to resist compressive stressing.

* * * * *